(12) United States Patent
Takao et al.

(10) Patent No.: US 9,425,235 B2
(45) Date of Patent: Aug. 23, 2016

(54) LIGHT EMITTING DEVICE INCLUDING RESIN PACKAGE HAVING DIFFERENTLY CURVED PARTS

(71) Applicant: NICHIA CORPORATION, Anan-shi, Tokushima (JP)

(72) Inventors: Toshimasa Takao, Tokushima (JP); Takeo Kurimoto, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 185 days.

(21) Appl. No.: 13/935,778

(22) Filed: Jul. 5, 2013

(65) Prior Publication Data

US 2014/0008672 A1    Jan. 9, 2014

(30) Foreign Application Priority Data

Jul. 9, 2012 (JP) .................................. 2012-153419

(51) Int. Cl.

| H01L 29/20 | (2006.01) |
|---|---|
| H01L 27/15 | (2006.01) |
| H01L 25/075 | (2006.01) |
| H01L 33/60 | (2010.01) |

(52) U.S. Cl.
CPC ........... *H01L 27/15* (2013.01); *H01L 25/0753* (2013.01); *H01L 33/60* (2013.01); *H01L 2924/0002* (2013.01)

(58) Field of Classification Search
CPC ....................................................... H01L 27/15
USPC ........ 257/88, 89, E33.055, E33.058; 438/27, 438/28
See application file for complete search history.

(56) References Cited

U.S. PATENT DOCUMENTS

| 2006/0131591 A1 | 6/2006 | Sumitani | |
| 2009/0001490 A1* | 1/2009 | Bogner | H01L 25/0753 257/432 |
| 2012/0153317 A1* | 6/2012 | Emerson et al. | 257/89 |
| 2012/0307481 A1* | 12/2012 | Joo et al. | 362/97.1 |

FOREIGN PATENT DOCUMENTS

| JP | 2001-196637 A | 7/2001 |
| JP | 2005-285874 A | 10/2005 |
| JP | 2006-173359 A | 6/2006 |
| JP | 2010-206039 A | 6/2010 |

\* cited by examiner

*Primary Examiner* — Matthew Gordon
(74) *Attorney, Agent, or Firm* — Global IP Counselors, LLP (57) ABSTRACT

A light emitting device, having: a first light emitting element and a second light emitting element; and a resin package equipped with an opening having a reflective wall that widens toward the upper face, the opening comprises at least first and second curved parts having different radiuses at the resin package upper face, and the radius of the first curved part disposed near the first light emitting element is greater than the radius of the second curved part disposed near the second light emitting element.

21 Claims, 4 Drawing Sheets

LIGHT EMITTING DEVICE INCLUDING RESIN PACKAGE HAVING DIFFERENTLY CURVED PARTS

CROSS-REFERENCE TO RELATED APPLICATIONS

This application claims priority to Japanese Patent Application No. 2012-153419 filed on Jul. 9, 2012. The entire disclosure of Japanese Patent Application No. 2012-153419 is hereby incorporated herein by reference.

BACKGROUND OF THE INVENTION

1. Field of the Invention

The present invention relates to a light emitting device.

2. Background Information

Recently, because of their advantages such as a compact size, low power consumption, and light weight, light emitting devices used in liquid crystal panels, large displays, and so forth have had light emitting elements with emission wavelengths such as RGB installed in a single package.

However, the light from the various light emitting elements is emitted to the outside with specific distribution characteristics, so merely installed the various RGB light emitting elements may not afford adequate color mixing, leading to an uneven color balance, and this inevitably results in variance in the distribution of emission colors.

There have been various proposals in response to this, such as a method in which the opening width of the resin package is varied according to the type of light emitting element (such as Japanese Laid-Open Patent Application 2001-196637), or a method in which the inclination angle of a reflector plate is varied in a resin package on one side of a light emitting element (such as Japanese Laid-Open Patent Application 2005-285874).

However, variance in the distribution of emitted light colors has yet to reach a satisfactory level with any light emitting device. Also, in regard to the shape of the opening in the resin package that makes up the light emitting device, when the opening width is further reduced, or when the angle of the reflective plate is set to be close to 90°, when mold releasability suffers in the manufacture of the resin package, for example, causing mold releasability problems such as the unintended deformation, breakage, and so forth of the resin package, and it has been impossible to manufacture a light emitting device in which emission variance can be prevented accurately.

SUMMARY OF THE INVENTION

The present invention was conceived in an effort to solve this problem, and it is an object thereof to provide a light emitting device with which variance in the distribution of emitted light colors is reduced, and resin package moldability is improved in the manufacture of the light emitting device, thereby controlling the distribution characteristics at a high degree of accuracy.

A light emitting device according to one aspect includes: a first light emitting element and a second light emitting element; and a resin package equipped with an opening having a reflective wall that widens toward the upper face, the opening comprises at least first and second curved parts having different radiuses of curvature at the resin package upper face, and the radius of curvature of the first curved part disposed near the first light emitting element is greater than the radius of curvature of the second curved part disposed near the second light emitting element.

With the light emitting device of the present invention, variance in the distribution of emitted light colors can be reduced. Also, the moldability of the resin package is improved in the manufacture of the light emitting device, thereby controlling the distribution characteristics at a high degree of accuracy. This allows a light emitting device of higher quality to be obtained.

BRIEF DESCRIPTION OF THE DRAWINGS

FIG. 1A is a plan view.

DETAILED DESCRIPTION OF EMBODIMENTS

The light emitting device of the present invention is constituted by at least two light emitting elements and a resin package.

Light Emitting Elements

The light emitting element is usually a semiconductor light emitting element, and may be any type of element that is known as a light emitting diode. At least two light emitting elements are installed, and preferably three, four, or more. At least one of these light emitting elements preferably has different characteristics from those of the other light emitting element (when there are two), or has different characteristics from those of some or all of the other light emitting elements (when there are three or more).

There are no particular restrictions on the "characteristics" here, but they are preferably distribution characteristics, for example. Therefore, examples include different compositions (including the compositional ratio) of the semiconductor layer (discussed below), outputs, brightness levels, heights of the elements themselves, and so forth. The phrase "height of the elements themselves" means the total thickness from the substrate lower face to the upper face of the semiconductor layer constituting the light emitting element when the light emitting elements comprise a substrate, or the total thickness from the lower face to the upper face of the semiconductor layer constituting the light emitting element when the substrate is omitted.

The light emitting elements are arranged in a single row in a specific direction within the opening of the resin package (discussed below). The "row" here is preferably one in which the elements are disposed linearly or substantially linearly, but they may instead be arranged in a zigzag pattern (that is, a shape constituting a V shape or W shape). For instance, as shown in FIG. 1, they are preferably arranged in a row in the arrow X direction.

With the light emitting device of the present invention, color reproducibility can be enhanced by combining a plurality of (and preferably three) light emitting elements with different emission colors of red, green, and blue, so as to corresponding to RGB, for example. Also, the optical output can be increased by combining a plurality of light emitting elements of the same emission color. When there elements are combined corresponding to RGB, it is preferable when red, green, and blue light emitting elements are arranged in a row in that order.

Examples of the light emitting elements include those in which a laminate structure including an active layer is formed from any of various kinds of semiconductor, such as InN, AlN, GaN, InGaN, AlGaN, InGaAlN, or another such nitride semiconductor, or GaAs, InAlGaP, or another such group III-V compound semiconductor or II-VI group compound semiconductor. Examples of the structure of the semiconductor include homo structures, hetero structure, or double hetero structure such as an MIS junction, a PIN junction, or a PN junction. Also, the semiconductor active layer may be a single quantum well structure or a multiple quantum well structure formed on a thin film that produces a quantum effect. The active layer may be doped with silicon, germanium, or another such donor impurity and/or zinc, magnesium, or another such acceptor impurity. The characteristics of the resulting light emitting element, such as the emission wavelength, can be varied from the ultraviolet band to red by varying the material of the semiconductor, the mixed crystal ratio, the content of a certain element in the active layer (such as indium in InGaN), the type of impurity with which the active layer is doped, and so on.

The light emitting elements are installed on a lead frame (discussed below), and a junction material is used to that end. For instance, with the light emitting element that emits blue or green light and that is formed by growing a nitride semiconductor on a sapphire substrate, an epoxy resin, silicone, or the like can be used. When degradation due to heat or light from the light emitting element is taken into account, the rear face of the light emitting element may be plated with aluminum, or no resin may be used, and eutectic Au—Sn or another such solder or low-melting point metal or other such solder may be used. Furthermore, when electrodes are formed on both sides of the light emitting element, as with a light emitting element that emits red light and is composed of GaAs or the like, die bonding may be performed with a conductive paste of silver, gold, palladium, or the like.

The light emitting elements are usually mounted face-up. That is, a pair of electrodes are formed on the same side of the light emitting element with respect to the substrate (or semiconductor layer), and the side on which the electrodes are formed faces the emission face in mounting, or the elements are installed on the light emitting device by flip-chip mounting, etc.

Resin Package

The resin package is a member used to install the light emitting elements, and may be formed from resin. As long as this function can be ensured, the resin package may be formed from any kind of resin. Examples include thermoplastic resins and thermosetting resins. More specifically, examples include polyimides (PI), polyamides (PA), polycarbonate resins, polyphenylene sulfide (PPS), liquid crystal polymers (LCP), ABS resins, epoxy resins, phenol resins, acrylic resins, PBT resins, resins used as package materials in this field (such as those discussed in Japanese Laid-Open Patent Applications 2011-256326 and 2011-178983), and other such resins. Various kinds of dye, pigment, or the like may also be mixed into these materials as colorants or light scattering agents. Examples of colorants include $Cr_2O_3$, $MnO_2$, $Fe_2O_3$, and carbon black. Examples of light scattering agents include calcium carbonate, aluminum oxide, and titanium oxide. This results in packages of various hues, such as a black package or a white package with high reflectivity, or which minimizes the amount of light emitted from the light emitting elements that is absorbed by the package.

A translucent resin is usually embedded at the opening (discussed below) of the resin package, so when adhesion between the translucent resin and the package under the influence of heat produced by the light emitting elements, etc., is taken into account, it is preferable to select materials having a small difference in their coefficients of thermal expansion.

There are no particular restrictions on the size and shape of the resin package, but examples of the external shape in plan view include circular, elliptical, triangular, quadrilateral, polyhedral, and shapes that are close to these. Of these, a shape that is quadrilateral or close to being quadrilateral in plan view is preferable. The size can be suitably adjusted by changing the size of the light emitting elements being used, and the number of light emitting elements installed.

Opening

The function of the resin package is to allow the light emitting elements to be installed and light to extract from the light emitting elements, and the resin package has an opening having a reflective wall that widens toward the upper face.

There are no particular restrictions on the shape of the opening plane (at the upper face of the resin package), which may be a shape close to being circular, elliptical, quadrilateral, etc. Moreover, the shape does not necessarily have to be one that is in point or line symmetry. Polyhedral shapes that are close to being quadrilateral in plan view, or shapes that are close to these, are particularly favorable. The size of the opening can be suitably adjusted according to the size of the light emitting elements being used and the number of light emitting elements installed.

Regardless of its shape, the opening has curved parts with at least two different radiuses of curvature at the resin package upper face. These curved parts having two different radiuses of curvature preferably comprise at least a pair of curved parts that are opposite each other in the direction in which the light emitting elements are arranged. The phrase "curved parts that are opposite each other in the direction in which the light emitting elements are arranged" here refers to the positional relation between a curved part a1 and a curved part b1 in the X direction, which is the layout direction of the light emitting elements; that is, it means that these parts are disposed facing each other in the layout direction X of the light emitting elements. The opening may be such that the curved part a1 and the curved part b1 are linked in the layout direction of the light emitting elements at the resin package upper face, or a linear portion may be disposed between the curved part a1 and the curved part b1.

The radius of curvature of the curved part disposed on a first light emitting element side (or on nearby first light emitting element) is greater than the radius of curvature of the curved part disposed on a second light emitting element side (or on nearby second light emitting element). The phrase "the curved part disposed on the first or second light emitting element side (or on nearby first light emitting element)" here refers to the curved part a1 facing the light emitting element 1 and adjacent to the light emitting element 1, or to the curved part b1 facing the light emitting element 3 and adjacent to the light emitting element 3 in FIG. 1, for example. When three or more light emitting elements are arranged as in FIG. 1, there is usually no curved part facing the light emitting element 2 (the one or more other than the light emitting elements disposed at the ends). When the curved parts of the opening 4a at the upper face of the resin package 4 shown in FIG. 2, for example, are expressed by the arrow a1 and the arrow b1, the term "radius of curvature" here means the radius of a circle formed by extending the curves at these positions.

The radius of curvature of a curved part can be suitably adjusted according to the size of the resin package and the opening, for example, with an opening or a light emitting element having a length on one side of between a few tenths of a millimeter to about 10 mm, the radius of curvature will be from a few hundredths of a millimeter to a few millimeters. For instance, with an opening or a light emitting element of about 1 mm to a few millimeters, the radius of curvature is preferably about 0.2 to 0.8 mm. Thus, the difference in the radius of curvature of the curved parts mentioned above is, for example, about 10 to 50% of one of the radiuses of curvature (such as the larger radius of curvature). More specifically, an example is about 0.05 to 0.5 mm.

In this case, the light emitting element facing the curved part with the large radius of curvature is preferably a light emitting element having a long emission wavelength, such as one that emits red light. A red light emitting element generally has a different composition of semiconductor layers that constitute the light emitting element from that of green and blue light emitting elements. That is, they are made up of different kinds of constituent atoms. Thus, the characteristics can be markedly different as compared to green and blue light emitting elements, such as a thicker active layer or other layers, taller elements, more light emission in the lateral direction, or lower drive voltage. With a light emitting element having such characteristics, it is possible for all of the light emitted from the light emitting element to be guided more narrowly by increasing the radius of curvature of the curved part adjacent to (facing) the element. As a result, when a red light emitting element is arranged along with a green and/or blue light emitting element, the color balance of these light emitting elements can be adjusted, and variance in the distribution of different emitted light colors can be reduced.

There are no particular restrictions on the shape of the opening in the resin package at the bottom face, which may be circular, elliptical, triangular, quadrilateral, a shape close to these, or the like. Of these, a polyhedral shape that is quadrilateral or close to being quadrilateral in plan view, or a shape that is close to these is preferable. The shape of the bottom face of the opening does not necessarily have to be in point or line symmetry.

Regardless of its shape at the bottom face, the opening has at least a pair of curved parts of the bottom face that are opposite each other in the layout direction of the light emitting elements at the resin package bottom face. The phrase "curved parts of the bottom face that are opposite each other in the layout direction of the light emitting elements" here refers to the positional relation between a curved part a2 and a curved part b2 in the X direction, which is the layout direction of the light emitting elements. The opening may be such that the curved part a2 and the curved part b2 are linked in the layout direction of the light emitting elements at the resin package upper face, or a linear portion may be disposed between the curved part a2 and the curved part b2. When the bottom face shape of the opening is triangular or a shape close to that, the curved parts may be opposite but slightly offset from the layout direction of the light emitting elements. Regardless of the shape of the bottom face of the opening, the curved part disposed near one of the arranged light emitting elements should have characteristics different from those of the curved part disposed near the other light emitting element.

The radius of curvature relation between the curved parts at the bottom face is the same as the radius of curvature relation between the curved parts at the upper face. However, the difference in the radius of curvature relation between the curved parts at the bottom face need not necessarily be the same as the difference in the radius of curvature relation between the curved parts at the upper face. When the curved parts of the opening 4a at the bottom face of the resin package 4 shown in FIG. 2, for example, are expressed by the arrow a2 and the arrow b2, the term "radius of curvature" here means the radius of a circle formed by extending the curves at these positions.

The radius of curvature of a curved part on the resin package upper face disposed near the first light emitting element is preferably greater than the radius of curvature of a curved part at the bottom face of the opening. For example, in FIGS. 1 and 2, the radius of curvature of the curved part a1 at the resin package upper face disposed near the light emitting element 1 is preferably greater than the radius of curvature of the curved part a2 at the bottom face of the opening. There are no particular restrictions on the difference in size, an example is about 5 to 30% of one radius of curvature (such as the radius of curvature at the upper face). More specifically, an example is about 0.02 to 0.3 mm.

In this case, the radius of curvature of a curved part at the resin package upper face disposed near the second light emitting element is preferably less than the radius of curvature of the curved part at the bottom face of the opening. For example, in FIGS. 1 and 2, the radius of curvature of the curved part b1 at the resin package upper face disposed near the light emitting element 3 is preferably less than the radius of curvature of the curved part b2 at the bottom face of the opening. There are no particular restrictions on the difference in size, but an example is about 5 to 30% of one radius of curvature (such as the radius of curvature at the upper face). More specifically, an example is about 0.02 to 0.3 mm.

The reflective wall that widens toward the upper face need not be present all the way around the opening, and part of the periphery of the opening may be perpendicular to the opening bottom face or to the upper face of the package, but it is preferable when this reflective wall is disposed all the way around the opening. That is, the reflective wall preferably narrows toward the bottom face, all the way around the opening. Because the reflective wall is inclined in this way, the light emitted from the light emitting elements can be reflected more efficiently in the direction of the extraction face (the upper face direction). However, the reflective wall may have a flat surface, or a curved surface.

This reflective wall is preferably inclined at different angles at different locations. In any case, the inclination angle of the reflective wall is preferably less than 90° and at least about 45° with respect to a plane corresponding to the opening bottom face or the upper face of the resin package, with about 60 to 80° being more preferable, and about 60 to 70° being even more preferable. This inclination angle not only increases the light-extraction efficiency as mentioned above, but also affords good mold releasability (i.e., partability) during molding of the resin package, allowing the resin package to be molded into the properly shape accurately and without being damaged.

In particular, when the light emitting elements are installed in a row, when the inclination angles of the reflective wall at locations that intersect an extension of a line connecting the light emitting elements are θ1 and θ2 (see FIG. 1B), and the inclination angle of the reflective wall at a location perpendicularly intersecting the center of a line connecting the light emitting elements inside the opening is θ3 (see FIG. 1C), then it is preferable when the inequalities θ3<θ1 and θ3<θ2 are satisfied. If, however, a plurality of light emitting elements are not arranged linearly, then it is preferable when an extension of a line connecting at least the two light emitting elements (preferably, the center of gravity of the light emitting elements, etc.) at the ends is an extension of a line connecting the light emitting elements. As shown in FIG. 2, the locations having θ1 and θ2 are expressed as location Pθ1 and location Pθ2, respectively, and the location having θ3 is expressed as location Pθ3.

The difference between the inclination angle θ3 and the inclination angles θ1 or θ2 is preferably about 5 to 20°, for example, more preferably about 7 to 15°, and even more preferably about 7 to 12°. In general, although it depends on the manufacturing method, when the opening shape is asymmetrical to a specific reference line, as with the resin package in this invention, mold releasability from a mold will be extremely poor when the resin package is formed by injection molding with a mold, etc., which is normally used. On the other hand, as discussed above, even if the shape is asymmetrical, mold releasability can be markedly improved by reducing the inclination (gradual inclination) at part of the resin package, such as at the location Pθ3. At locations where the radius of curvature of the curved part is great, the resin package may be pulled by the mold during releasing, thus causing unintended stress to be locally exerted on the resin package, and this can lead to deformation or damage of the resin package, but deformation and damage caused by such stress can also be effectively prevented by reducing the inclination as discussed above.

Figure 1A:
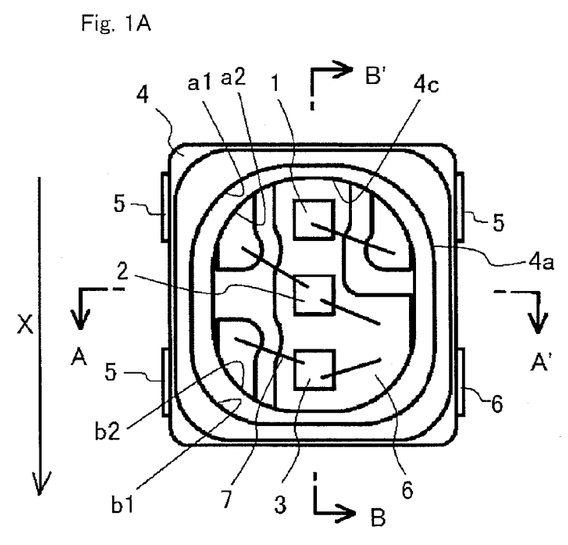

As shown in FIG. 1A, when the inclination angle of the reflective wall near the red light emitting element is θ1, and the inclination angle of the reflective wall near the blue light emitting element is θ2, the inclination angle θ1 and the inclination angle θ2 may be the same, but θ1 is preferably greater than θ2. That is, the relation θ2≤θ1 is preferably satisfied. Satisfying this relation improves light distribution.

Furthermore, the inclination angle of the reflective wall from the location Pθ1 to the location Pθ3 may be the same as the inclination angle of the reflective wall from the location Pθ2 to the location Pθ3, but a curved part disposed near the first light emitting element and a curved part disposed near the second light emitting element (that is, a curved part near the location Pθ1 and a curved part near the location Pθ2) are preferably different from each other since the radiuses of curvature are different at the opening of the resin package bottom face and/or the opening at the resin package upper face.

For example, the inclination angle near the center of each curved part (the locations Pa3 and Pb3 in FIG. 2) is preferably balanced with mold releasability and/or light distribution characteristics and set to the optical angle, regardless of θ1, θ2, and θ3. More specifically, the inclination angle near the center of each curved part may be greater or less than θ1 and θ2, and greater or less than θ3, but the inclination angle near the center of a curved part near the first light emitting element is preferably less than θ1 and greater than θ3. Also, the inclination angle near the center of a curved part near the second light emitting element is preferably less than θ2 and less than θ3. The lower limit to the inclination angle in this case may be within about 9° from the inclination angle of θ1, and preferably within about 5°, and is within about 5° from the inclination angle of θ3, and preferably within about 3°.

Thus setting the inclination angles, without deformation and damage caused by unintended local stress at the resin package, in particular during the mold releasing of the resin package, effectively prevents deformation and damage of the resin package.

The depth of the opening can be suitably adjusted by varying the height of the light emitting elements being used, the bonding method, and so forth. For instance, the this depth is preferably about 1.5 to 10 times the thickness of the light emitting elements, more preferably about 1.5 to 5 times, and even more preferably about 2 to 5 times. More specifically, the depth is about 0.1 to 1 mm, preferably about 0.2 to 0.6 mm, and more preferably about 0.25 to 0.35 mm. The opening bottom face and/or the reflective wall are preferably subjected to embossing, plasma treatment, or the like to increase its surface area and improve its adhesion to the translucent resin (discussed below).

Figure 4:
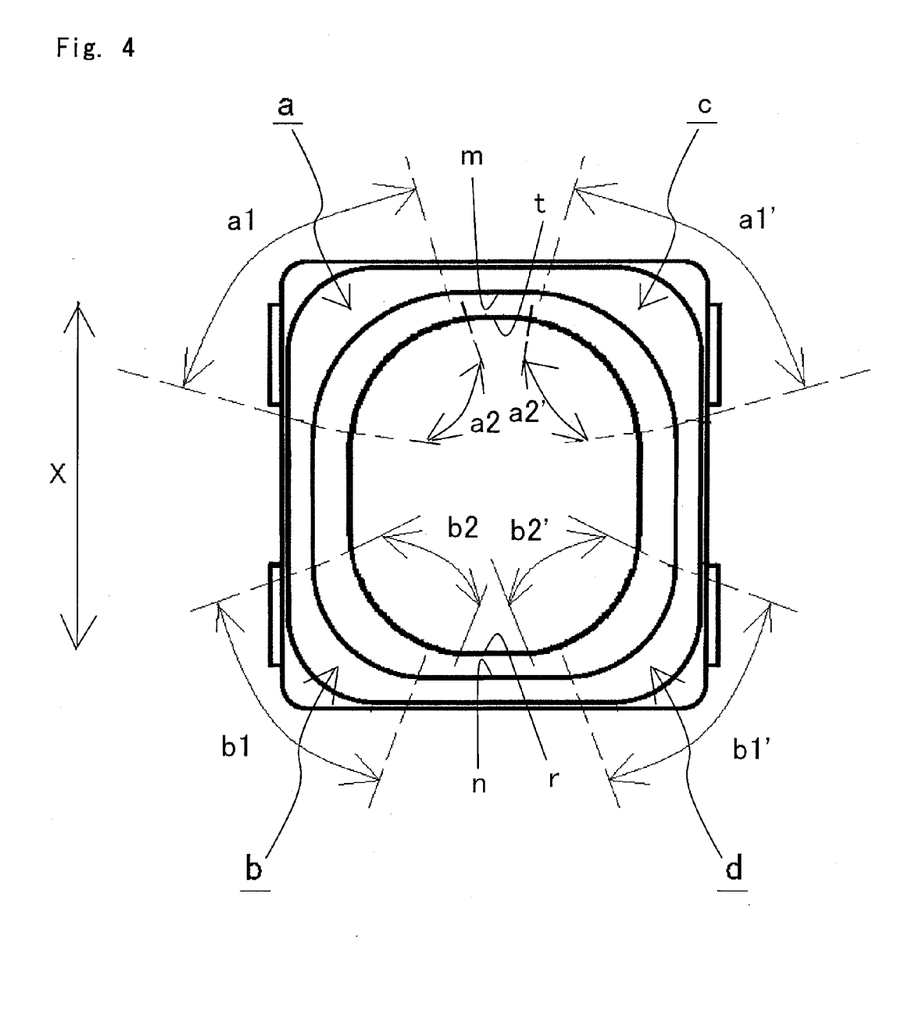
FIG. 4 is a simplified plan view of the main components, illustrating the relationship of the curved parts of the light emitting device of the present invention.

An embodiment of the light emitting device of the present invention can be applied to a resin package having an opening with four curved parts on both of the upper face and the bottom face of the opening, regardless of whether the resin package includes the above described configuration. More specifically, as shown in FIG. 4, when the upper face of the opening of the resin package has a shape that includes curved parts a1 and b1 (examples of first and second curved parts), and also includes curved parts a1' and b1' (example of third and fourth curved parts) disposed at symmetrical positions to the curved parts a1 and b1, respectively, with respect to an extension line of the layout direction X of the light emitting elements, the curved parts a1 and a1' may be continuous. Alternatively, a linear part (one example of a first linear part) may be disposed between the curved part a1 and the curved part a1'. Likewise, the curved parts b1 and b1' may be continuous, or a liner part (one example of a second linear part) may be disposed between the curved parts b1 and b1'.

When a linear part is disposed between the curved parts at and a1' and a linear part is disposed between the curved parts b1 and b1', the length m of the linear part between the curved parts a1 and a1' is preferably shorter than the length n of the linear part between the curved parts b1 and b1' as shown in FIG. 4.

When the bottom face of the opening of the resin package has a shape that includes curved parts a2 and b2 (examples of fifth and sixth curved parts), and also includes curved parts a2' and b2' (examples of seventh and eighth curved parts) disposed at symmetrical positions to the curved parts a2 and b2, respectively, with respect to an extension line of the layout direction X of the light emitting elements, the curved parts a2 and a2' positioned symmetrically may be continuous. Alternatively, a linear part (one example of a third linear part) may be disposed between the curved part a2 and the curved part a2'. Likewise, the curved parts b2 and b2' positioned symmetrically may be continuous, or a liner part (one example of a fourth linear part) may be disposed between the curved parts b2 and b2'.

When a linear part is disposed between the curved parts a2 and a2', the length t of the linear part between the curved parts a2 and a2' is preferably shorter than a length of one side of the first light emitting element in plan view (see, FIGS. 1A and 4).

When a linear part is disposed between the curved parts a2 and a2' and a linear part is disposed between the curved parts b2 and b2', the length t of the linear part between the curved parts a2 and a2' is preferably shorter than the length r of the linear part between the curved parts b2 and b2'.

Furthermore, the length r of the linear part between the curved parts b2 and b2' is preferably longer than a length of one side of the second light emitting element in plan view (see, FIGS. 1A and 4).

Furthermore, a radius of curvature of the curved part a1 is preferably the same as a radius of curvature of the curved part a1', and a radius of curvature of the curved part b1 is preferably the same as a radius of curvature of the curved part b1'. Likewise, a radius of curvature of the curved part a2 is preferably the same as a radius of curvature of the curved part a2', and a radius of curvature of the curved part b2 is preferably the same as a radius of curvature of the curved part b2'.

With such arrangements, variation in the distribution of emission colors can be reduced.

A protective element may be installed along with the light emitting elements in the light emitting device of the present invention. There may be just one protective element, or two or more may be used. There are no particular restrictions on the protective element here, and any known type that is installed in light emitting devices may be used. More specifically, examples include circuits that protect against overheating, over-voltage, and over-current, and electrostatic protective elements. The location of installation may be inside the opening and near the light emitting elements, but preferably all or part of the protective element is embedded in the resin package.

Lead Frame

A lead frame is partially embedded in the resin package of the present invention. A lead frame is a member used for installing light emitting elements. It also serves as an electrode and lead terminal that are electrically connected to the light emitting elements. Therefore, the light emitting elements are placed on a part of the lead frame that is not embedded and fixed inside the resin package, the lead frame is exposed inside the opening of the resin package (at the bottom face thereof) to make an electrical connection, and the rest of the lead frame protrudes outside the package. The exposure of part of the surface of the lead frame at the opening bottom face reflects light from the light emitting elements and allows this light to extract efficiently in the forward (front face) direction.

Two or more lead frames are usually provided to a single light emitting device, and there may be a quantity equal to 1 or more plus the number of light emitting elements, or to two or more times the number of light emitting elements. For example, when three light emitting elements are mounted, then three light emitting elements are placed on a single lead frame, and these light emitting elements are electrically connected to the other lead frames on which they are not mounted, respectively.

A plurality of lead frames is disposed in the package so that they are substantially isolated electrically, besides the electrical connection with the electrodes of the light emitting elements mentioned above.

The lead frame may be substantially in the form of a plate, but may be in the form of a board having bumps or a corrugated board. There are no particular restrictions on the material, but a material may be used that can supply the appropriate power to the light emitting elements. The lead frame is preferably formed from a material with a relatively high coefficient of thermal conductivity. When the lead frame is formed from such a material, heat generated by the light emitting elements can be efficiently released. For example, it is preferable to use a material having a thermal conductivity of at least 200 W/(m·K), or one having a relatively high mechanical strength, or one that lends itself to punch stamping, etching, or the like. More specifically, examples include copper, aluminum, gold, silver, tungsten, iron, nickel, and other such metals, and iron-nickel alloys, phosphor bronze, and other such alloys. The surface of the lead frame is preferably given a reflective plating (such as with silver, a silver alloy, Ni/Pd/Au, or the like) so that light from the installed light emitting elements will extract more efficiently. The size, thickness, shape, and so forth of the lead frame can be suitably adjusted by taking into account the size, shape, and so forth of the light emitting device to be obtained.

The location to which the lead frame extends outside the package (that is, the lead terminals) can be suitably adjusted for shape, size, etc., by taking into account how the light emitting device will be used (the space where it is installed, the installation position, etc.) and the heat dissipation of the light emitting elements installed in the light emitting device. The lead terminals can be suitably bent or deformed according to how the device will be used, such as the positional relation with other electronic devices.

The light emitting elements may just be mounted on the lead frame, without it being electrically connected to the light emitting elements, or it may be one on which no light emitting elements are mounted and which is not electrically connected to light emitting elements. It is preferable when one end of such a lead frame has a larger surface area than the portion that functions as the lead terminals, for example. This allows the lead frame to function as a heat dissipation circuit that guides heat generated by the light emitting elements inside the package to the outside, and as an over-voltage countermeasure.

Wires

With the light emitting device of the present invention, a pair of electrodes formed on the light emitting element is electrically connected by wires with the lead frame and/or electrodes of the adjacent light emitting elements in order to supply power to the light emitting elements.

There are no particular restrictions on the material, diameter, and so forth of the wires, and any wires that are normally used in this field can be utilized. It is particularly favorable to use wires that have good ohmic properties with the electrodes of the light emitting elements, or that have good mechanical connectivity, or that have good electrical conductivity and thermal conductivity.

The wires can be made, for example, from gold, copper, platinum, aluminum, silver, or another such metal, or alloys of these, or the wire surface may be covered with silver or a silver alloy. Of these, silver, copper, lead, aluminum, platinum, and alloys of these are preferable as materials with high reflectivity, and silver or a silver alloy is more preferable. An example of a commercially available product is SEA (trade name of Tanaka Precious Metals), which is a wire containing 87.7 vol % silver, 8.7 vol % gold, and 3.6 vol % palladium.

There are no particular restrictions on the diameter of the wire, but an example is about 10 to 70 μm, with about 15 to 50 μm being preferable, and about 18 to 30 μm (such as 25 μm) being more preferable.

The thermal conductivity of the wire is preferably at least about 0.01 cal/S·cm$^{2.\circ}$ C./cm, and more preferably at least about 0.5 cal/S·cm$^{2.\circ}$ C./cm.

Translucent Resin

With the light emitting device of the present invention, a translucent resin is preferably embedded in the opening in which the light emitting elements are installed.

The translucent resin is a member that seals part of the light emitting elements, wires, and conductive members to protect them against dust, moisture, external force, and so on. A base polymer of the translucent resin is preferably formed from a material that can transmit the light emitted from the light emitting elements (preferably with a transmissivity of at least 70%).

More specifically, examples include addition- or condensation-type silicone resin, epoxy resin, phenol resin, polycarbonate resin, acrylic resin, ABS resin, polybutylene terephthalate resin, polyphthalamide resin, polyphenylene sulfide resin, liquid crystal polymer, and hybrid resins including one or more of these resins.

The translucent resin is preferably one of the above-mentioned resins that contains a metal complex and/or a metal salt containing zinc. The addition of zinc allows gas, particularly that containing sulfur atoms, to be effectively trapped, which reduces the sulfurization of silver.

For example, an example is a translucent resin that contains a zinc complex having as a ligand a zinc salt of phosphoric acid or a phosphate, or an acid or an ester of a zinc salt of phosphoric acid or a phosphate.

More specifically, the translucent resin preferably contains zinc bisacetyl acetate, zinc bis-2-ethyl hexanoate, zinc (meth)acrylate, zinc neodecanoate, and other such carboxylates, zinc oxide, zinc stannate, or the like.

When a translucent resin such as this is used, it dramatically reduces sulfurization caused when sulfur-containing gas reaches the silver or silver alloy used as lead frame, plating on the lead frame surface, or wiring.

The translucent resins discussed in Japanese Laid-Open Patent Applications 2011-256326, 2011-137140, 2011-178983, and so forth can be used, for example.

The translucent resin may also contain a diffusion agent or a fluorescent substance. A diffusion agent is used to diffuse the light, which moderates the directivity from the light emitting elements and expands the viewing angle. A fluorescent substance is used to convert light from the light emitting elements, and converts the wavelength of the light emitted from the light emitting elements to the exterior of the package. When the light from the light emitting elements is visible light, which has high energy and a short wavelength, then a perylene derivative (an organic fluorescent substance), ZnCdS:Cu, YAG:Ce, nitrogen-containing CaO—Al$_2$O$_3$—SiO$_2$ that has been activated with europium and/or chromium, or another such inorganic fluorescent substance, or the like can be used to advantage. With the present invention, when white light is obtained, and particularly when a YAG:Ce fluorescent substance is utilized, depending on the content thereof, it is possible to emit light from a blue light emitting element and yellow light that is a complementary color and partially absorbs this blue light, so white light can be formed relatively simply and with good reliability. Similarly, when nitrogen-containing CaO—Al$_2$O$_3$—SiO$_2$ that has been activated with europium and/or chromium is used, depending on the content thereof it is possible to emit light from a blue light emitting element and red light that is a complementary color and partially absorbs this blue light, so white light can be formed relatively simply and with good reliability. Also, the fluorescent substance can be completely precipitated and bubbles removed, allowing color unevenness to be reduced.

An embodiments of the light emitting device of the present invention will be described in detail through reference to the drawings.

Figure 1B:
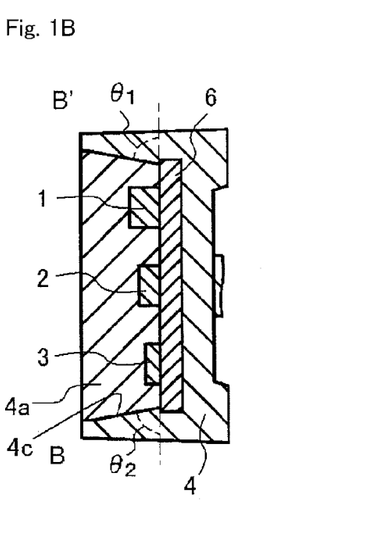
FIGS. 1B and 1C are simplified cross sections along the B-B' line and along the C-C' line, respectively, illustrating the light emitting device of the present invention.
Figure 1C:
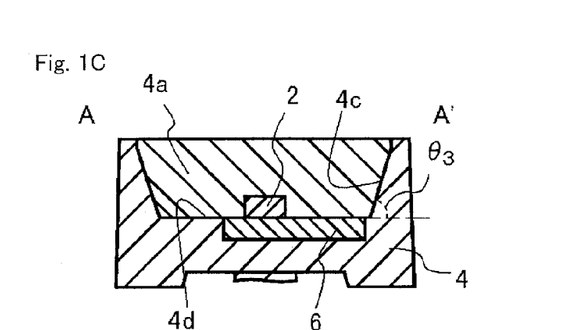
Figure 2:
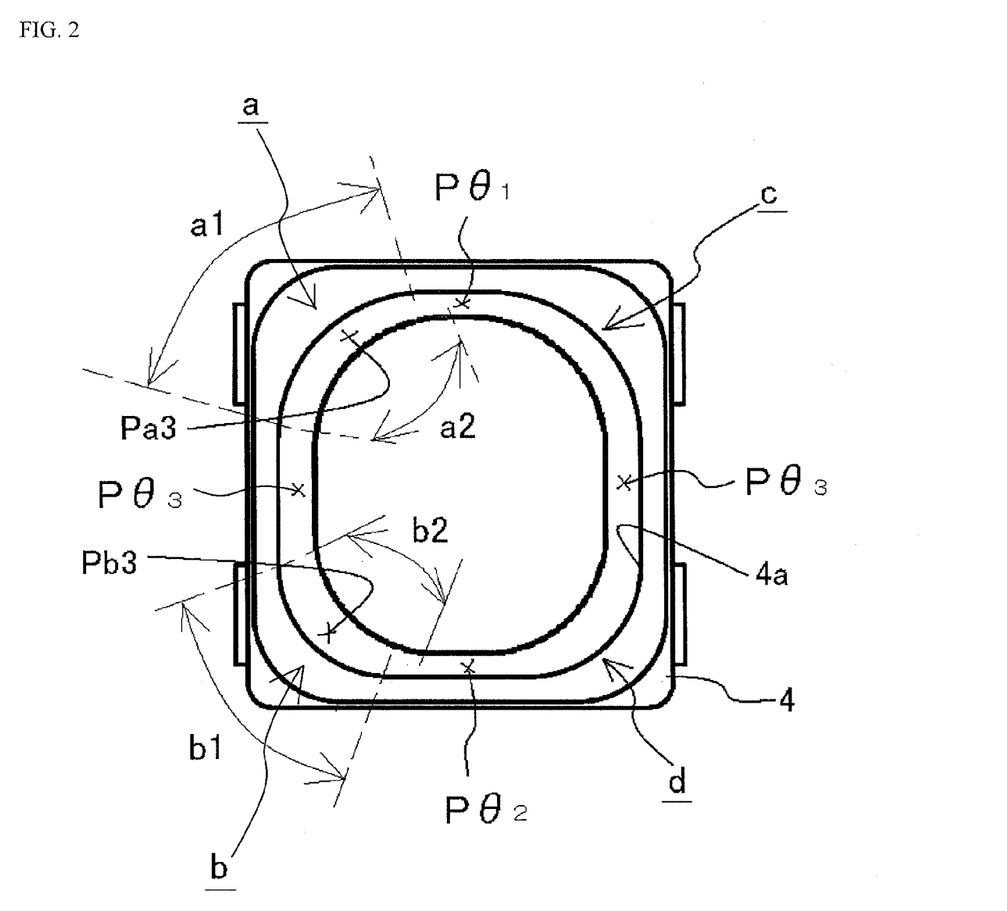
FIG. 2 is a simplified plan view of the main components, illustrating the inclination angle of the reflective wall and the curved parts of the light emitting device of the present invention.
Figure 3A:
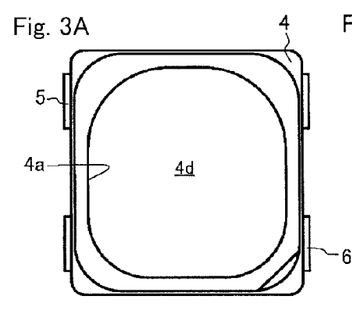
FIG. 3A is a plan view of the light emitting device in FIG. 1 (with the reflective wall and light emitting elements omitted)
Figure 3B:
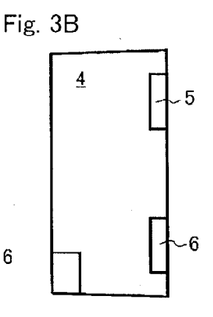
FIG. 3B is a right side view.
Figure 3C:
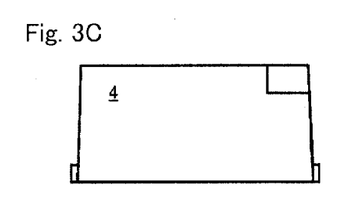
FIG. 3C is a lower face view.
Figure 3D:
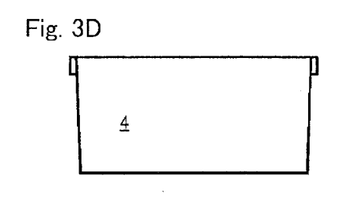
FIG. 3D is an upper face view.
Figure 3E:
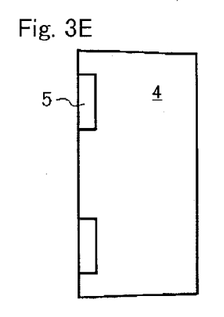
FIG. 3E is a left side view.
Figure 3F:
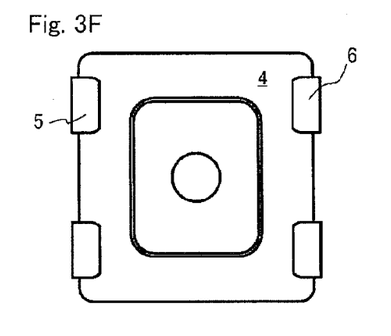
FIG. 3F is a bottom view.

As shown in FIGS. 1 to 3, the light emitting device in this embodiment comprises three light emitting elements 1, 2, and 3 corresponding to RGB, and a resin package 4 in which these are installed inside an opening 4a.

The light emitting device is formed in a shape corresponding to a rectangle whose plan view shape is close to being square. For example, the upper face measures about 1.8×1.7 mm, and is about 0.84 mm high. The opening has an oval shape when viewed from above (front face), and the depth of the opening 4a is about 0.45 mm.

The red light emitting element 1, the green light emitting element 2, and the blue light emitting element 3 are arranged linearly in that order in the X direction in FIG. 1.

The red light emitting element 1 is formed by a structure in which an InAlGaP-based semiconductor layer is affixed to a silicon substrate, and the element height thereof is about 170 μm. The green light emitting element 2 and the blue light emitting element 3 are formed by a structure in which GaN-based semiconductor layers are laminated on a sapphire substrate, and the element height thereof is about 120 μm and 85 μm, respectively.

Parts of lead frames 5 and 6 are exposed at the locations where the light emitting elements 1, 2, and 3 are installed on the bottom face 4d of the opening 4a of the resin package 4, and the light emitting elements 1, 2, and 3 are electrically connected to each other by wires 7. The parts of the lead frames 5 and 6 other than the locations exposed at the bottom face 4d of the opening 4a are embedded in the resin package 4, and protrude outside of the resin package as external terminals, created a top view type of configuration.

The opening has two pairs of curved parts, each of which are opposite each other, in a direction facing the layout direction X of the light emitting elements on the upper face of the resin package 4. In FIG. 1, these correspond to the curved part a1 and the curved part b1, and in FIG. 2 to the upper face parts of the curved parts c and d corresponding to these curved parts a1 and b1.

The radius of curvature of the curved part a1 disposed on the red light emitting element 1 side (nearby red light emitting element) is set to 0.6 mm, for example, the radius of curvature of the curved part b1 disposed on the blue light emitting element 3 side (nearby blue light emitting element) is set to 0.45 mm, for example, and the radius of curvature of the curved part a1 is greater than the radius of curvature of the curved part b1. At the upper face of the resin package 4, the curved part a and the curved part c have the same shape, and the curved part b and the curved part d have the same shape.

The opening also has two pairs of curved parts that face in the layout direction of the light emitting elements, on the bottom face. In FIG. 1, these correspond to the curved part a2 and the curved part b2, and in FIG. 2 to the bottom face parts of the curved parts c and d corresponding to these curved parts a2 and b2.

The radius of curvature of the curved part a2 disposed on the red light emitting element 1 side (nearby red light emitting element) is set to 0.55 mm, for example, the radius of curvature of the curved part b2 disposed on the blue light emitting element 3 side (nearby blue light emitting element) is set to 0.5 mm, for example, and the radius of curvature of the curved part a2 is greater than the radius of curvature of the curved part b2. At the bottom face of the opening 4a of the resin package 4, the curved part a and the curved part c have the same shape, and the curved part b and the curved part d have the same shape.

With these curved part radiuses of curvature, the radius of curvature of the curved parts at the upper face of the resin package 4 disposed on the red light emitting element side (nearby red light emitting element) is greater than the radius of curvature of the curved parts at the bottom face 4d of the opening 4a.

The radius of curvature of the curved parts at the upper face of the resin package 4 disposed on the blue light emitting element 3 side (nearby blue light emitting element) is less than the radius of curvature of the curved parts at the bottom face 4d of the opening 4a.

Inside the opening 4a, when the inclination angles of the reflective wall 4c at the location P$\theta$1 and the location P$\theta$2 that intersect an extension of a line connecting the light emitting elements 1, 2, and 3 are $\theta$1 and $\theta$2 respectively, and the inclination angle of the reflective wall at the location P$\theta$3 that perpendicularly intersects a line connecting the first light emitting elements 1, 2, and 3 is $\theta$3, then $\theta$3 is set to about 72°, $\theta$1 to about 79°, and $\theta$2 to about 79°.

The inclination angle of the reflective wall near the center location Pa3 of the curved part near the red light emitting element 1 is set to about 75°. The inclination angle of the reflective wall near the center location Pb3 of the curved part near the blue light emitting element 3 is set to about 70°.

With this light emitting device, the inclination angle of the reflective wall constituting the opening of the resin package is controlled according to the characteristics of the light emitting elements, which allows variation in the distribution of emission colors attributable to these characteristics to be reduced, and makes it possible for the color balance of these light emitting elements to be suitable adjusted. In particular, since the various layers and the active layer are thicker or the elements are taller with a red light emitting element than that with green and blue light emitting elements, the characteristics are markedly different, such as the emission face is located higher, there is more light emitted in the lateral direction, and the drive voltage is lower, but even with a light emitting element having such characteristics, all of the light emitted from the light emitting element can be guided more narrowly by controlling the radius of curvature of the curved part that is adjacent to (faces) this element. As a result, even if a red light emitting element is arranged along with a green and/or blue light emitting element, the color balance of these light emitting elements can be adjusted and variance in the distribution of different emission colors can be reduced. This results in higher emission efficiency.

Also, good mold releasability during resin package molding can be ensured by controlling the radius of curvature of the curved parts and by controlling the inclination angle of the reflective wall, so the resin package can be formed accurately, in the desired shape, without being deformed or damaged.

The light emitting device of the present invention can be utilized not only as a lighting device used in facsimile machines, copiers, band scanners, and other such image reading devices, but also in various other kinds of lighting device, such as illumination light sources, LED displays, backlights for portable telephones and the like, signaling machines, illuminated switches, vehicle stop lamps, various sensors, and various indicators.

What is claimed is:

1. A light emitting device comprising:
   a first light emitting element and a second light emitting element; and
   a resin package equipped with an opening having a reflective wall that widens toward a resin package upper face, wherein
   the opening comprises at least first and second curved parts having different radiuses of curvature at the resin package upper face, and third and fourth curved parts disposed at the resin package upper face,
   a radius of curvature of the first curved part disposed near the first light emitting element is greater than a radius of curvature of the second curved part disposed near the second light emitting element, and
   the radius of curvature of the first curved part is the same as a radius of curvature of the third curved part, and the radius of curvature of the second curved part is the same as a radius of curvature of the fourth curved part.

2. The light emitting device according to claim 1, wherein the first curved part and the second curved part face each other in the direction in which the first and second light emitting elements are arranged.

3. The light emitting device according to claim 1, wherein the first and second light emitting elements have different light distribution characteristics.

4. The light emitting device according to claim 3, wherein the light emitting elements with the different light distribution characteristics are light emitting elements with different element heights.

5. The light emitting device according to claim 1, wherein the first and second light emitting elements have different emission wavelengths, and
   the emission wavelength of the first light emitting element is longer than the emission wavelength of the second light emitting element.

6. The light emitting device according to claim 1, wherein an emission face of the first light emitting element is located higher than an emission face of the second light emitting element.

7. The light emitting device according to claim 1, wherein a thickness of the first light emitting element is larger than a thickness of the second light emitting element.

8. The light emitting device according to claim 1, wherein the first light emitting element and the second light emitting element are disposed on a bottom face in the opening, and
   an amount of light emitted from a side face of first light emitting element is greater than an amount of light emitted from a side face of the second light emitting element, the side face of the first light emitting element and the side face of the second light emitting element extending substantially perpendicular to the bottom face.

9. The light emitting device according to claim 1, wherein a drive voltage of the first light emitting element is lower than a drive voltage of the second light emitting element.

10. The light emitting device according to claim 1, wherein the first light emitting element is a light emitting element having a red emission wavelength, and the second light emitting element is a light emitting element having a blue emission wavelength.

11. The light emitting device according to claim 1, wherein
when inclination angles of the reflective wall at respective locations that intersect with an extension of a line connecting the first light emitting element and the second light emitting element are θ1 and θ2 respectively, and an inclination angle of the reflective wall at a location intersecting a line that perpendicularly intersects the center part of the line connecting the first light emitting element and the second light emitting element within the opening is θ3, θ3<θ1 and θ3<θ2 are satisfied.

12. The light emitting device according to claim 11, wherein
when the inclination angle of the reflective wall near the first light emitting element is θ1, and the inclination angle of the reflective wall near the second light emitting element is θ2, θ2≤θ1 is satisfied.

13. The light emitting device according to claim 1, wherein
the opening comprises at least two bottom curved parts of different radiuses of curvature on a bottom face of the opening, and
a radius of curvature of one of the bottom curved parts disposed near the first light emitting element is greater than a radius of curvature of one of the bottom curved parts disposed near the second light emitting element.

14. The light emitting device according to claim 1, further comprising
a third light emitting element,
the first, second, and third light emitting elements having red, green, and blue emission wavelengths respectively and being installed in a row in that order.

15. The light emitting device according to claim 1, wherein
the third and fourth curved parts are disposed at symmetrical positions to the first and second curved parts, respectively, with respect to a layout direction of the first and second light emitting elements.

16. The light emitting device according to claim 1, wherein
the opening comprises fifth and sixth curved parts having different radiuses of curvature at a bottom face of the resin package, and seventh and eighth curved parts disposed at the bottom face at symmetrical positions to the fifth and sixth curved parts, respectively, with respect to a layout direction of the first and second light emitting elements, and
a radius of curvature of the fifth curved part is the same as a radius of curvature of the seventh curved part, and a radius of curvature of the sixth curved part is the same as a radius of curvature of the eighth curved part.

17. A light emitting device comprising:
a first light emitting element and a second light emitting element; and
a resin package equipped with an opening having a reflective wall that widens toward a resin package upper face, wherein
the opening comprises at least first and second curved parts having different radiuses of curvature at the resin package upper face, wherein the first curved part is at a location symmetrical to a location of the second curved part and
a radius of curvature of the first curved part disposed near the first light emitting element is greater than a radius of curvature of the second curved part disposed near the second light emitting element,
the opening comprises at least two bottom curved parts of different radiuses of curvature on a bottom face of the opening,
a radius of curvature of one of the bottom curved parts disposed near the first light emitting element is greater than a radius of curvature of one of the bottom curved parts disposed near the second light emitting element,
the radius of curvature of the first curved part on the resin package upper face disposed near the first light emitting element is greater than the radius of curvature of the one of the bottom curved parts disposed near the first light emitting element at the bottom face of the opening, and
the radius of curvature of the second curved part at the resin package upper face disposed near the second light emitting element is less than the radius of curvature of the one of the bottom curved parts disposed near the second light emitting element at the bottom face of the opening.

18. A light emitting device comprising:
a first light emitting element and a second light emitting element; and
a resin package equipped with an opening having a reflective wall that widens toward a resin package upper face, wherein
the opening comprises at least first and second curved parts having different radiuses of curvature at the resin package upper face, and third and fourth curved parts disposed at the resin package upper face at symmetrical positions to the first and second curved parts, respectively, with respect to a layout direction of the first and second light emitting elements, with a first linear part being disposed between the first curved part and the third curved part and a second linear part being disposed between the second curved part and the fourth curved part, and
a length of the first linear part is shorter than a length of the second linear part, and
a radius of curvature of the first curved part disposed near the first light emitting element is greater than a radius of curvature of the second curved part disposed near the second light emitting element.

19. A light emitting device comprising:
a first light emitting element and a second light emitting element; and
a resin package equipped with an opening having a reflective wall that widens toward a resin package upper face, wherein
the opening comprises at least first and second curved parts having different radiuses of curvature at the resin package upper face,
a radius of curvature of the first curved part disposed near the first light emitting element is greater than a radius of curvature of the second curved part disposed near the second light emitting element,
the opening comprises fifth and sixth curved parts having different radiuses of curvature at a bottom face of the opening, and seventh and eighth curved parts disposed at the bottom face of the opening at symmetrical positions to the fifth and sixth curved parts, respectively, with respect to a layout direction of the first and second light emitting elements, with a third linear part being disposed between the fifth curved part and the seventh curved part and a fourth linear part being disposed between the sixth curved part and the eighth curved part, the fifth and seventh curved parts are disposed near the first light emitting element and the sixth and eighth curved parts are disposed near the second light emitting element, and a length of the third linear part is shorter than a length of one side of the first light emitting element in plan view.

20. The light emitting device according to claim 19 wherein the length of the third linear part is shorter than a length of the fourth linear part.

21. The light emitting device according to claim 19, wherein a length of the fourth linear part is longer than one side of the second light emitting element in plan view.

\* \* \* \* \*